(12) United States Patent
Van Nieuwenhove et al.

(10) Patent No.: US 11,598,850 B2
(45) Date of Patent: Mar. 7, 2023

(54) APPARATUS AND METHOD FOR ILLUMINATION

(71) Applicant: Sony Semiconductor Solutions Corporation, Kanagawa (JP)

(72) Inventors: Daniel Van Nieuwenhove, Hofstade (BE); Ward Van Der Tempel, Muizen (BE)

(73) Assignee: Sony Semiconductor Solutions Corporation, Kanagawa (JP)

(*) Notice: Subject to any disclaimer, the term of this patent is extended or adjusted under 35 U.S.C. 154(b) by 412 days.

(21) Appl. No.: 16/462,980

(22) PCT Filed: Nov. 30, 2017

(86) PCT No.: PCT/EP2017/081021
§ 371 (c)(1),
(2) Date: May 22, 2019

(87) PCT Pub. No.: WO2018/100082
PCT Pub. Date: Jun. 7, 2018

(65) Prior Publication Data
US 2019/0293764 A1  Sep. 26, 2019

(30) Foreign Application Priority Data
Nov. 30, 2016  (EP) ..................... 16201402

(51) Int. Cl.
*G01C 3/08*  (2006.01)
*G01S 7/481*  (2006.01)
(Continued)

(52) U.S. Cl.
CPC .......... *G01S 7/4815* (2013.01); *G01S 7/4868* (2013.01); *G01S 17/894* (2020.01);
(Continued)

(58) Field of Classification Search
CPC .... G01S 7/4815; G01S 7/4868; G01S 17/894; G01S 17/89; H01S 5/0428; H01S 5/423; H01S 5/005; H01S 5/0087
See application file for complete search history.

(56) References Cited

U.S. PATENT DOCUMENTS

| | | | |
|---|---|---|---|
| 2005/0224946 A1* | 10/2005 | Dutta | G02B 6/4257 257/686 |
| 2012/0287646 A1* | 11/2012 | Mandelboum | G01S 7/484 362/311.01 |

(Continued)

FOREIGN PATENT DOCUMENTS

WO  WO 2013/127975 A1  9/2013

OTHER PUBLICATIONS

International Search Report and Written Opinion for International Application No. PCT/EP2017/081021 dated May 4, 2018.
(Continued)

*Primary Examiner* — Mark Hellner
(74) *Attorney, Agent, or Firm* — Wolf, Greenfield & Sacks, P.C.

(57) ABSTRACT

An apparatus has an illumination layer having an array of a plurality of illuminators, and a circuit layer having one or more drivers for controlling the plurality of illuminators. The laser layer and the circuit layer overlap at least partially, and each driver of the one or more drivers controls at least one illuminator of the plurality of illuminators.

16 Claims, 6 Drawing Sheets

(51) Int. Cl.
*G01S 7/486* (2020.01)
*H01L 25/16* (2023.01)
*H01L 27/15* (2006.01)
*H01S 5/042* (2006.01)
*H01S 5/42* (2006.01)
*H01L 27/146* (2006.01)
*G01S 17/894* (2020.01)
*H01S 5/00* (2006.01)
*H01S 5/0234* (2021.01)
*H01S 5/02345* (2021.01)

(52) U.S. Cl.
CPC ...... *H01L 25/167* (2013.01); *H01L 27/14643* (2013.01); *H01L 27/156* (2013.01); *H01S 5/0428* (2013.01); *H01S 5/423* (2013.01); *H01S 5/005* (2013.01); *H01S 5/0071* (2013.01); *H01S 5/0234* (2021.01); *H01S 5/02345* (2021.01); *H01S 5/0425* (2013.01)

(56) References Cited

U.S. PATENT DOCUMENTS

| | | |
|---|---|---|
| 2013/0163627 A1 | 6/2013 | Seurin et al. |
| 2013/0272330 A1 | 10/2013 | Joseph et al. |
| 2015/0085887 A1 | 3/2015 | Deppe |
| 2015/0092258 A1* | 4/2015 | Herschbach ............ H01S 5/423 |
| | | 359/238 |
| 2015/0260830 A1 | 9/2015 | Gosh et al. |
| 2016/0178991 A1* | 6/2016 | Wan ....................... G03B 15/05 |
| | | 362/11 |
| 2016/0182789 A1 | 6/2016 | Wan et al. |
| 2016/0247791 A1* | 8/2016 | Tan ..................... H01L 25/0657 |
| 2018/0106891 A1* | 4/2018 | Thurner ................ G01S 17/894 |

OTHER PUBLICATIONS

Carson et al., Progress in High-power, High-Speed VCSEL Arrays. Proceedings of SPIE. 2016;9766. 15 pages.

Duan et al., A novel 3D stacking method for opto-electronic dies on CMOS ICs. 2012 38$^{th}$ European Conference and Exhibition on Optical Communications. Sep. 16, 2012. 3 pages.

* cited by examiner

ABSTRACT AND METHOD FOR ILLUMINATION

APPARATUS AND METHOD FOR ILLUMINATION

CROSS REFERENCE TO RELATED APPLICATIONS

This application claims the benefit under 35 U.S.C. § 371 as a U.S. National Stage Entry of International Application No. PCT/EP2017/081021, filed in the European Patent Office as a Receiving Office on Nov. 30, 2017, which claims priority to European Patent Application Number 16201402.1, filed in the European Patent Office on Nov. 30, 2016, the entire contents of each of which is hereby incorporated by reference.

TECHNICAL FIELD

The present disclosure generally pertains to an apparatus and a method, which can be generally used in the technical field of time-of-flight cameras.

TECHNICAL BACKGROUND

Generally, a time-of-flight (ToF) camera is known, which sends a pulsed modulation wave to a target and measures a time delay, for example, until a dedicated image is sensed or which measures the time delay between reflections in an observed scene and each pixel of a pixel sensor. Typically, for one depth image, multiple ToF images have to be acquired with different phase delays, e.g. 0/90/180/270 in the case of continuous ToF.

Moreover, as typically all timings need to be synchronized, it is known that the whole system is aligned in timing, which can be achieved by using the known global shutter technology. In the global shutter technology, the whole image is illuminated and imaged in one go, i.e. at the same point of time or within a common time period.

For increasing the performance of ToF cameras under bright sunlight situations, for example, the light flux in the scene can be increased, which, may be achieved without increasing the average power. This can be done, for example, by reducing the field of view (FOV), as then the same power is applied to a smaller area and, thus, the light flux is increased. However, reducing the field of view (FOV) is not useful in all applications.

Another known possibility is to increase a peak power of the illumination, which creates a higher flux for a shorter time period with the same overall energy. For illumination, lasers such as Vertical Cavity Surface Emitting Laser cells, which may be arranged in an array, can be used. However, this typically requires a huge capacitor and power source adapted to illuminate 300 W peak power with sharp edges as driver for the lasers. Such type of laser drivers may be inefficient and it may be difficult to integrate in portable devices, such as mobile phones, cameras, tablets or the like.

It is generally desirable to provide an apparatus and a method which are able to improve the ToF technology.

SUMMARY

According to a first aspect, the disclosure provides an apparatus including an illumination layer including an array of a plurality of illuminators; and a circuit layer including one or more drivers for controlling the plurality of illuminators; wherein the illumination layer and the circuit layer overlap at least partially; and wherein each driver of the one or more drivers controls at least one illuminator of the plurality of illuminators.

According to a second aspect, the disclosure provides a method including illuminating, with illumination light originating from an illuminator apparatus, a scene, and acquiring an image of the scene; wherein the illuminator apparatus includes an illumination layer including an array of a plurality of illuminators, and a circuit layer including one or more drivers for controlling the plurality of illuminators, wherein the illumination layer and the circuit layer overlap at least partially, and wherein each driver of the one or more drivers controls at least one illuminator of the plurality of illuminators.

Further aspects are set forth in the dependent claims, the following description and the drawings.

BRIEF DESCRIPTION OF THE DRAWINGS

Embodiments are explained by way of example with respect to the accompanying drawings, in which.

DETAILED DESCRIPTION OF EMBODIMENTS

Figure 1:
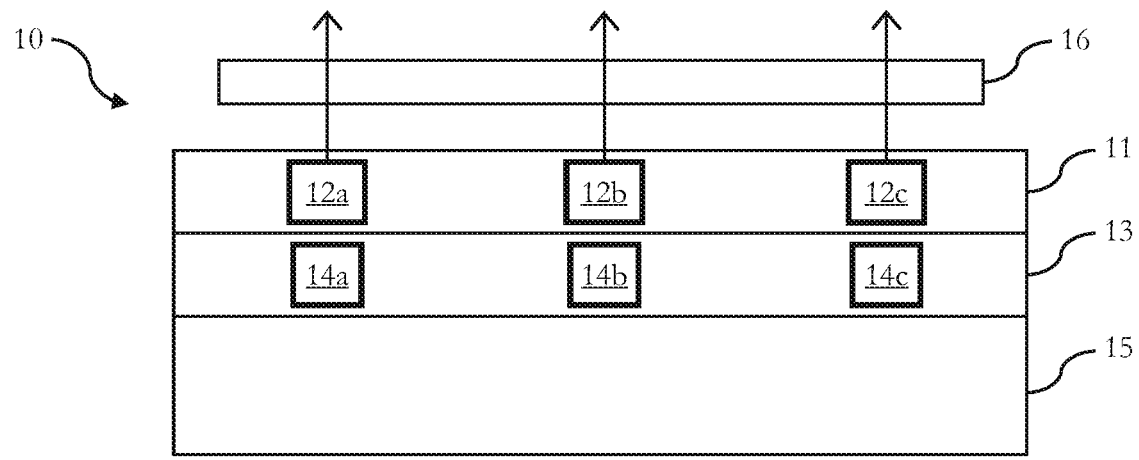
FIG. 1 illustrates an embodiment of an illuminator apparatus.

Before a detailed description of the embodiments under reference of FIG. 1, general explanations are made.

As mentioned in the outset, generally, a time-of-flight (ToF) camera is known, which sends a pulsed modulation wave to a target and measures a time delay, for example, until a dedicated image is sensed or which measures the time delay between reflections in an observed scene and each pixel of a pixel sensor. The observed scene may be a part of the world that is accessible, for example, to the ToF camera, for illumination or image acquisition. Typically, for one depth image, multiple ToF images have to be acquired with different delays, e.g. with phase delays 0/90/180/270 degrees in the case of continuous ToF.

Moreover, as typically all timings need to be synchronized, it is known that the whole system is aligned in timing, which can be achieved by and using the known global shutter technology. In the global shutter technology, the whole image is illuminated and imaged in one go, i.e. at the same point of time or within a common time period.

For increasing the performance of ToF cameras under bright sunlight situations, for example, the light flux in the scene can be increased, which may be achieved without increasing the average power. This can be done, for example, by reducing the field of view (FOV), as then the same power is applied to a smaller area and, thus, the light flux is increased. However, reducing the field of view (FOV) is not useful in all applications.

Another known possibility is to increase a peak power of the illumination, which creates a higher flux for a shorter time period with the same overall energy. For illumination, lasers such as Vertical Cavity Surface Emitting Laser cells, which may be arranged in an array, can be used. However, this typically requires as driver for the lasers a huge capacitor and power source adapted to illuminate for example a 300 W peak power with sharp edges. Such type of laser drivers may be inefficient and it may be difficult to integrate in portable devices, such as mobile phones, cameras, tablets or the like.

It has also been recognized that, when illuminating the whole scene at once, interreflections between different parts of the scene may create multipaths in the scene, or interreflections in a lens cavity of a ToF camera may create multipath in the lens and might bounce on adjacent pixels of an image sensor of the camera such that accuracy of distance measurement may be decreased. Additionally, by illuminating the scene at once, the whole data throughput may be concentrated in one read-out.

Consequently, some embodiments pertain to an apparatus having an illumination layer including an array of a plurality of illuminators, as they are generally known. The apparatus further has a circuit layer including one or more (a plurality of) drivers for controlling the plurality of illuminators. The illumination layer and the circuit layer overlap at least partially, and each driver of the one or more (plurality of) drivers controls at least one illuminator of the plurality of illuminators.

Generally, an illuminator may be any illuminating device, and, in some embodiments, an illuminator may be a Vertical Cavity Surface Emitting Laser (VCSEL), a light emitting diode (LED), a side emitting laser or the like.

In the following and generally in this disclosure, embodiments will be exemplary explained referring to VCSELs as an example for the illuminators, and it is to be noted that similar embodiments can be envisaged using other illumination types, such as light emitting diodes (LEDs), side emitting lasers or the like and as mentioned above.

A Vertical Cavity Surface Emitting Laser (VCSEL) typically has, in layers seen from top to bottom, a metal contact, an upper Bragg reflector (e.g. p-type), a quantum well and a lower Bragg reflector (n-type) which may be arranged on a substrate (e.g. n-type).

A VCSEL may be provided as a cell, wherein a cell may include one or more VCSELs. The cells may have a low power consumption. Hence, by combining multiple VCSELs (cells), a high power VCSEL can be provided.

The illumination (e.g. laser, LED or the like)) layer includes multiple illuminators (e.g. VCSEL, LED, etc.) elements or structures, which may be arranged in an array-like structure. For example, the illuminators may be arranged in multiple parallel rows, which are parallel to each other, and in multiple columns, which are also parallel to each other, wherein the rows and columns are perpendicular to each other. Such a type of array is only given for illustration purposes and other array structures may be used, where for example the rows and columns are not perpendicular to each other, but form a different angle. In principle, the multiple illuminators may be arranged in any type of regular or irregular pattern within the laser layer.

The circuit layer is adapted to drive the illuminators, i.e. by providing respective power to the single illuminators. Hence, the drivers are adapted to provide a respective control and operation power to the illuminators of the laser layer. The circuit layer may include for each illuminator an own associated driver or the circuit layer may include a layout such that a single driver operates multiple, e.g. 2 or more, illuminators. The drivers may include electronic components, e.g. on a semiconductor level, which are needed for driving an illuminator, such as transistors, analog-digital-converters, etc.

Due to the overlapping of the illumination (e.g. laser) layer and the circuit layer, the drivers of the illumination layer may be arranged next to one or more associated illuminators (e.g. VCSELs), such that a compact and integrated design can be realized in some embodiments.

Hence, some embodiments provide a fast and/or high power illuminator apparatus, e.g. a high power Vertical Cavity Surface Emitting Laser. In some embodiments, for high power illuminator applications, at least one of a high peak current with more than 100 A, short peak pulse width, fast rise and fall times, and low voltage operation is needed, which may be difficult to be achieved with known VCSELs, but which may be realized in some embodiments.

In some embodiments, the illumination (e.g. laser) layer and the circuit layer are stacked to each other. The stacking may be based on a stacking technology which is used, for example, for a stacked Complementary Metal-Oxide-Semiconductor (CMOS) image sensor which is generally known, or may be based on a generally known three-dimensional integrated circuit technology.

In contrast to known integrated solutions using system-in-package technology, which may add high inductances, in some embodiments, the performance of high power VCSELs is improved by using the stacking technology, a per-VCSEL connection is made between each VCSEL cell (or group of VCSEL cells) and a dedicated driver per VCSEL cell or cell group. Thereby, voltage requirements may be lowered by reducing the unit inductance, e.g. per row and/or column of the VCSEL array.

In some embodiments, the apparatus includes a support substrate, e.g. Si-substrate or the like, and the illumination (e.g. laser) layer and the circuit layer are stacked on the support substrate. For example, the circuit layer may be grown on the substrate and on top of the circuit layer, the illumination layer may be stacked (or vice versa, i.e. the illumination layer is grown on the substrate and the circuit layer may be stacked onto the illumination layer).

In some embodiments, the illumination (e.g. laser) layer is grown (and/or stacked) onto the support substrate and the circuit layer is grown (and/or stacked) on the illumination layer, or the circuit layer is grown (and/or stacked) onto the support substrate and the illumination layer is grown (and/or stacked) on the circuit layer.

In some embodiments, illuminators (e.g. Vertical Cavity Surface Emitting Lasers, LEDs or the like) of the plurality of illuminators are arranged in a first row and a second row, and a first driver of the plurality of drivers is configured to control the illuminators of the first row, and a second driver of the plurality of drivers is configured to control the illuminators of the second row. Thereby, for example, the VCSELs are addressable per VCSEL row and/or column and they may be connected with the associated driver(s) per row and/or column. Moreover, multiple laser drivers may be created per VCSEL and there is not one big laser driver, but drivers are provided depending on the number of rows and/or columns. By making the connection between the VCSELs and laser drivers, e.g. IC (integrated circuit), very efficient by using flip-chip or stacking, the parasitic inductance becomes very low in some embodiments.

In some embodiments, each driver of the one or more (plurality of) drivers is configured to control one illuminator (e.g. Vertical Cavity Surface Emitting Laser, LED or the like) of the plurality of illuminators. In other words, each individual illuminator (e.g. VCSEL, LED or the like) is driven or operated by a single associated driver. Thereby, flexible and individual illumination control can be provided in some embodiments.

In some embodiments, each driver of the one or more drivers is configured to control a subset of illuminators of the plurality of illuminators. The subset may be predetermined or it may be selected on a case by case basis, based on a respective application, or the like.

In some embodiments, an optical element is provided on the laser layer for diffusing and/or directing light emitted from the VCSELs in a predetermined direction. Such optical elements may include diffusors which are generally known and are also known, for example, as smart glasses or smart windows. Various materials and techniques are known which produce this effect, e.g. polymer-dispersed liquid crystals. The optical element may also include a lens element, or any other optical elements, e.g. a lightpipe, set of lense surfaces or the like.

In an embodiment, the apparatus includes a first optical element configured to adjust (e.g. diffuse or direct) light emitted by at least one illuminator (e.g. Vertical Cavity Surface Emitting Laser, LED or the like) of the plurality of illuminators (e.g. Vertical Cavity Surface Emitting Lasers, LEDs or the like) which is controlled by a first driver of the plurality of drivers, and a second optical element configured to adjust (e.g. diffuse or direct) light emitted by at least one illuminator (e.g. Vertical Cavity Surface Emitting Laser, LED or the like) of the plurality of illuminators (e.g. Vertical Cavity Surface Emitting Lasers, LEDs or the like) which is controlled by a second driver of the plurality of drivers. Thereby, light emitted from, for example, the VCSELs can be selectively controlled/adjusted/diffused and/or directed by controlling the first and second optical element. In some embodiments, at least one driver of the plurality of drivers and/or the circuit layer is configured to control and/or drive the first and/or second optical element.

In some embodiments, the apparatus further comprises multiple adjustable lenses, such as microlenses or the like, for adjusting light emitted from the plurality of illuminators, e.g. Vertical Cavity Surface Emitting Lasers, LEDs or the like. Hence, in some embodiments, instead of or in addition to the diffusor(s) the lenses are provided for adjusting the light emitted from the illuminators.

This may be done, for example, with VCSEL diffusors or special microlens techniques as shown in the article "Progress in High-Power, High-Speed VCSEL Arrays", Richard F. Carson et al., Proceedings of the SPIE, Volume 9766, Paper 97660B, 2016.

In some embodiments, the apparatus further includes an image sensor, and circuitry being configured to control the image sensor and the one or more (plurality of) drivers. Hence, in some embodiments, the apparatus is configured as digital camera, time-of-flight camera or the like, which can also be provided in an electronic device, such as a computer, mobile phone, smartphone, wearable device, tablet PC or the like. The circuitry may include a processor, microprocessor, dedicated circuits, transistors, storage means, memory, etc. and other electronic components. Moreover, the circuitry may be configured to control the apparatus. In some embodiments, the circuitry includes the circuit layer and/or provides functions of the circuit layer as discussed herein, in particular functions related to the driving and controlling of the illuminators, e.g. VCSELs, LEDs or the like. The image sensor can be a charge coupled device (CCD) sensor, a CMOS (Complementary metal-oxide-semiconductor) or the like. The image sensor may include an array of pixels, as it is generally known.

In some embodiments, the circuitry is further configured to sequentially drive drivers of the one or more (plurality of drivers), thereby providing a zone shutter procedure, wherein, for example, all or a subset of drivers may be driven sequentially. Hence, in some embodiments, at least a subset of the one or more (i.e. plurality) of drivers may be driven sequentially. As will also be discussed further below, the subset of drivers may be selectively chosen and, for example, also the sequence of driving them may be selectively chosen, such that it is custom in some embodiments. The sequence may be static chosen and/or dynamically chosen. In the zone shutter procedure, only a part or subgroup of the plurality of drivers, and thus, only a part or subgroup of the plurality of illuminators (VCSELs, LEDs or the like) are operated at a certain point of time, such that only a zone of the illumination (laser) layer is operated at a certain point of time. For example, a first part or subgroup of the plurality of illuminators (e.g. VCSELs, LEDs, etc.) operated at a first point of time may illuminate a first part of a scene for a first image, and a second part or subgroup of the plurality of illuminators (VCSELs, LEDs, etc.) operated at a second point of time may illuminate a second part of the scene for a second image. In some embodiments, thereby electronic components, e.g. analog-digital-converter (ADC) circuits, drivers, transistors, etc., may be re-used when driving another zone of the illumination (e.g. laser) layer such that the overall number of electronic components may be reduced.

In some embodiments, at least one of the circuitry and the image sensor is further configured to control pixels in a zone of the image sensor on which a current region of interest is imaged to integrate light detection signals. Hence, in some embodiments only pixels of the zone where the region of interest is located are controlled for integrating light detection signals, while the other pixels, e.g. outside the region of interest, are ignored. As will also discussed further below, ignoring pixels may mean that pixels are kept in a reset state, that they are turned off and/or that they are kept static.

In some embodiments, the circuitry is further configured to perform a calibration procedure. For example, emitting light is directed to a predefined surface, e.g. a white wall, white paper or the like, and/or the apparatus is arranged in a predetermined distance to a scene, e.g. white wall, white paper, etc., and the reflected light is measured. Thereby, a calibration of an emitted and/or received light spectrum and/or of a distance measurement can be performed.

As mentioned, in some embodiments, the circuitry is further configured to perform a time-of-flight measurement, for example, for determining a distance between the apparatus and a scene illuminated with light emitted from the illumination (e.g. laser) layer.

Some embodiments pertain to a method which includes illuminating (at least parts of) a scene, and acquiring an image of the scene or part of the scene, wherein the illuminator apparatus, as discussed herein, includes an illumination (e.g. laser, LED or the like) layer including an array of a plurality of illuminators (e.g. Vertical Cavity Surface Emitting Lasers, LEDs or the like), and a circuit layer including one or more (a plurality of) drivers for controlling the plurality of Vertical Cavity Surface Emitting Lasers, wherein the illumination layer and the circuit layer overlap at least partially, and wherein each driver of the one or more (plurality of) drivers controls at least one illuminator of the plurality of illuminators. Illuminating a scene does not mean in all embodiments that the whole scene is illuminated, but also only part of a scene may be illuminated. The illumination may be performed with illumination light originating from an illuminator apparatus, e.g. an illuminator apparatus as discussed herein. The method may also include determining a distance between the illuminator apparatus and the scene, as it is known in the time-of-flight camera technology. The method can be performed by a computer, a processor, a microprocessor, by the apparatus (e.g. its circuitry) as describe herein, by an electronic device in which the apparatus described herein is arranged, etc.

In some embodiments, the method further includes identifying regions of the image, based on illumination light detected. Thereby, for example, a specific region of interest can be illuminated.

These regions or zones may be overlapping or non-overlapping, depending on the specific application and the associated embodiments. Overlapping may guarantee that the whole scene is illuminated and contributes to the active imaging, while non-overlapping may further allow to concentrate the light in even smaller zones or regions.

In some embodiments, the method further includes illuminating a first part of the scene corresponding to a first region of the image at a first time, acquiring an image of the scene or part of the scene at a second time, illuminating a second part of the scene corresponding to a second region of the image at a third time, and acquiring an image of the scene or part of the scene at a fourth time. Thereby, a rolling zone shutter procedure can be implemented, that can be compared to the known rolling shutter used in CMOS Image Sensors, or a zone shutter procedure can be implemented, as it is described above.

In some embodiments, the method further comprises integrating light detection signals of pixels in a zone of the image sensor on which the current region of interest is imaged, as also describe above. As mentioned, in some embodiments, only pixels of the zone where the region of interest is located are controlled for integrating light detection signals, while the other pixels, e.g. outside the region of interest, are ignored.

In some embodiments, the sequence used in the zone shutter is custom, as also mentioned above, i.e. it may be selectively chosen in accordance with given requirements. For example, a possible specific implementation of a zone shutter is a rolling shutter, wherein in a rolling shutter implementation the sequence is made, such that the zones are scanned chronologically. In other implementations, custom sequences can be chosen, such as static, e.g. pre-configured, or dynamically, e.g. configurable and reconfigurable at run-time based on other run-time conditions, as will be also explained further below.

In some embodiments, the method further includes performing an image processing procedure on a region of a first image while acquiring a second image. Thereby, illumination and image acquisition can be performed simultaneously.

In some embodiments, the method further includes integrating, during image acquisition, a light detection signal of a first region of the image for a longer time than a light detection signal of a second region of the image. Hence, in some embodiments, illuminating and integrating are preformed (nearly) at the same time or simultaneously. The light detection signals originate from the image sensor, e.g. from single pixels of the image sensor. By integrating the light detection signals, it is possible to detect whether e.g. a single pixel has acquired information.

In some embodiments, the method further includes integrating, during image acquisition, a light detection signal of a region of the image until an amount of illumination light detected reaches a threshold.

In some embodiments, the method further includes integrating, during image acquisition, a light detection signal of a first region of the image, while not integrating a light detection signal of a second region of the image. As will also discussed further below, the second region of the image may be indicated by a flag or the like at runtime, e.g. during performing the integration, i.e. the integration may be dictated by the flag which is set in the sense that for pixels for which the flag is set the light detection signal is not integrated.

Returning to FIG. 1, there is illustrated an illuminator apparatus 10 for illuminating, for example, a scene and which can be used, e.g. for a ToF camera.

The apparatus 10 has a laser layer 11 which has multiple VCSEL cells, wherein three VCSEL cells 12a, 12b and 12c are depicted in FIG. 1.

Below the laser layer 11, a driver layer 13 is located which includes multiple drivers, wherein three drivers 14a, 14b and 14c are depicted in FIG. 1.

The drivers 14a, 14b and 14c are located directly below the associated VCSEL cells 12a, 12b and 12c such that an electric connection is made short and, thus, parasitic elements, capacitance, inductance, impedance of electric path or wire and the like, may be reduced.

The circuit layer 13 is grown on a support substrate 15, e.g. a silicon substrate, and the laser layer 11 is grown directly on the circuit layer 13, such that the laser layer 11 is stacked on the circuit layer 13, as it is known, for example, for the stacked CMOS sensor, or for other three-dimensional integrated circuits.

In other embodiments, the wafer processing of a driver/circuit wafer, e.g. made of Silicon, is performed separately from the laser wafer processing, wherein the laser wafer may be made of a III-V semiconductor. Then, the separately processed wafers can be interconnected on the basis of a wafer-to-wafer interconnection and/or on the basis of a three-dimensional integration method, as it is known, for example, for the stacked CMOS sensor.

In still other embodiments, a stacking of dies may be made after singulation of the dies.

Moreover, a diffusor 16 is arranged on top on the laser layer 11 for directing and diffusing light emitted from the VCSEL cells 12a, 12b and 12c.

Hence, the order of the layers is from top to bottom: substrate 15, circuit layer 13, laser layer 11 and diffusor 16.

In the following, three embodiments will be described under reference of FIGS. 2 to 4 having different layouts.

Figure 2:
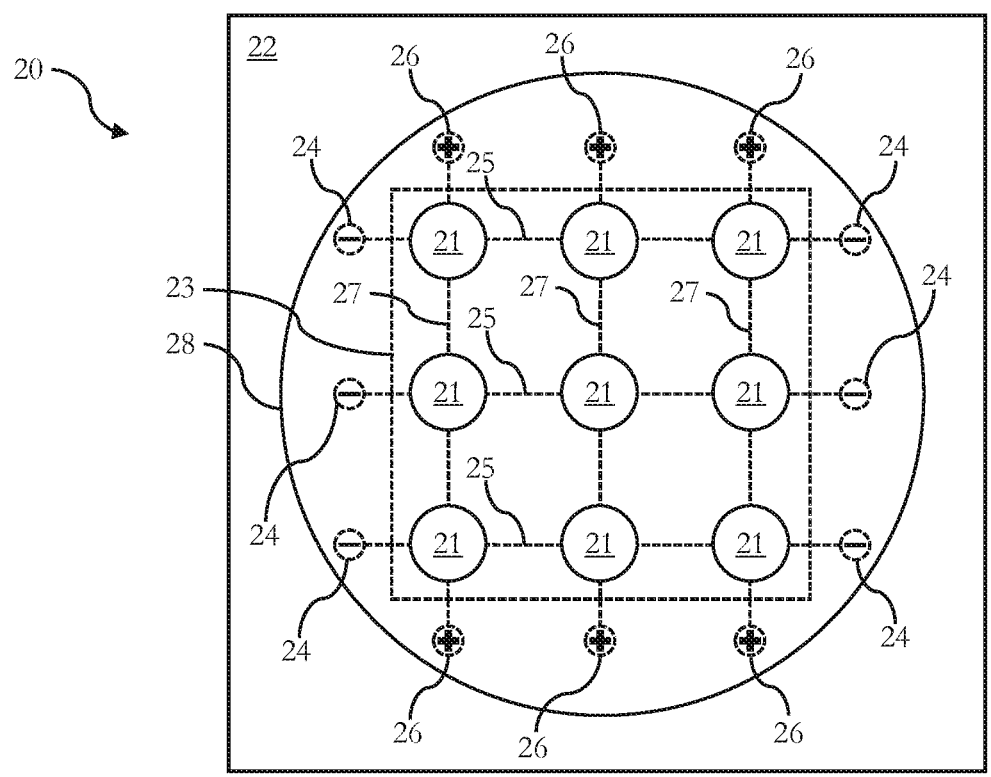
FIG. 2 illustrates another embodiment of an illuminator apparatus.

FIG. 2 illustrates an illuminator apparatus 20, which is generally similar to the apparatus 10 of FIG. 1, i.e. which has a similar stacking of a laser and a circuit layer stacked on a substrate. The apparatus 20 has a plurality of VCSEL cells 21 which are arranged in array, i.e. in multiple parallel rows and parallel columns, wherein the rows and columns are perpendicular to each other. The VCSEL cells 21 are arranged in a laser layer 22, which is similar to the laser layer 11 of FIG. 1.

Below the laser layer 22, a driver section 23 (which may be implemented as a circuit layer similar to circuit layer 13 of FIG. 1) is located.

The driver section 23 has multiple cathodes 24, which are each connected to wires 25, wherein one wire 25 connects VCSEL cells 21 of one row to each other. In other words, each row has at least one cathode connection 24.

The driver section 23 has also multiple anode connections 26, which are connected to wires 27, wherein one wire 27 connects VCSEL cells 21 of a column to each other. In other words, each column has at least one anode connection 26.

The driver section 23 also has multiple drivers, as already discussed in FIG. 1, which are located below and connected to the cathode 24 and anode connections 26 and which drive the VCSEL cells 21.

Moreover, a global diffusor 28 is provided on top of the laser layer 22 for adjusting the light emitted from the VCSEL cells 21.

In the embodiment of FIG. 2, the VCSEL cells 21 are addressable per row and column.

Figure 3:
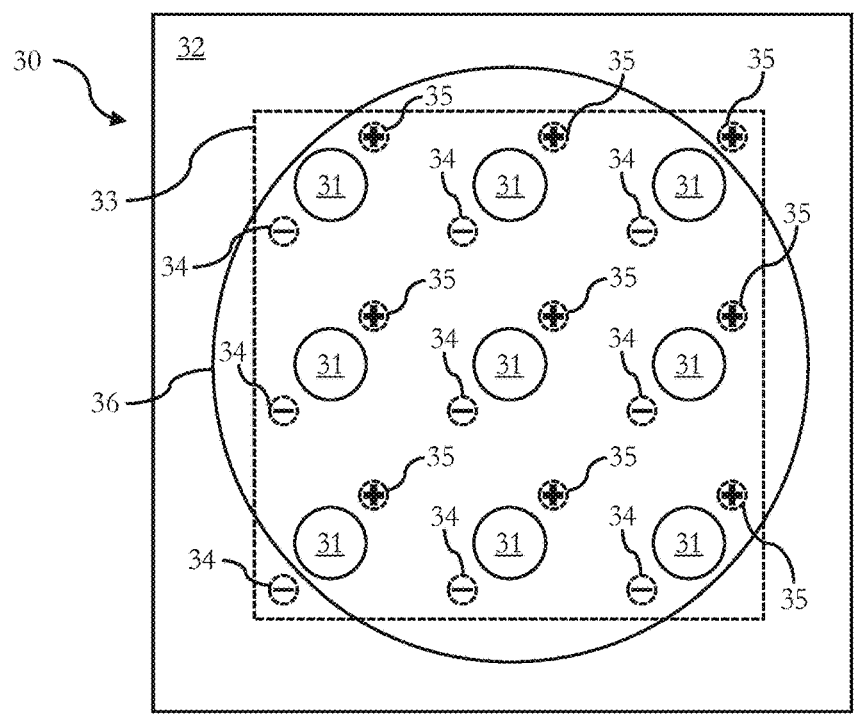
FIG. 3 illustrates another embodiment of an illuminator apparatus.

FIG. 3 illustrates an illuminator apparatus 30, which is generally similar to the apparatus 10 of FIG. 1, i.e. which has a similar stacking of a laser and a circuit layer stacked on a substrate. The apparatus 30 has a plurality of VCSEL cells 31 which are arranged in array, i.e. in multiple parallel rows and parallel columns, wherein the rows and columns are perpendicular to each other. The VCSEL cells 31 are arranged in a laser layer 32, which is similar to the laser layer 11 of FIG. 1.

Below the laser layer 32, a driver section 33 (which may be implemented as a circuit layer similar to circuit layer 13 of FIG. 1) is located.

The driver section 33 has multiple cathodes 34 and multiple anodes 35, wherein for each VCSEL cell 31 one pair of one cathode 34 and one anode 35 is provided.

The driver section 33 also has multiple drivers, as already discussed in FIG. 1, which are located below each of the VCSEL cells 31 and each driver is connected to the associated pair of cathode 34 and anode 35 for driving the associated VCSEL cell 31.

Moreover, a global diffusor 36 is provided on top of the laser layer 32 for adjusting the light emitted from the VCSEL cells 31.

In the embodiment of FIG. 3, the VCSEL cells 31 are each individually addressable, wherein in other embodiments the VCSEL cells 31 may be addressable in predetermined groups, for example, as also discussed above.

Figure 4:
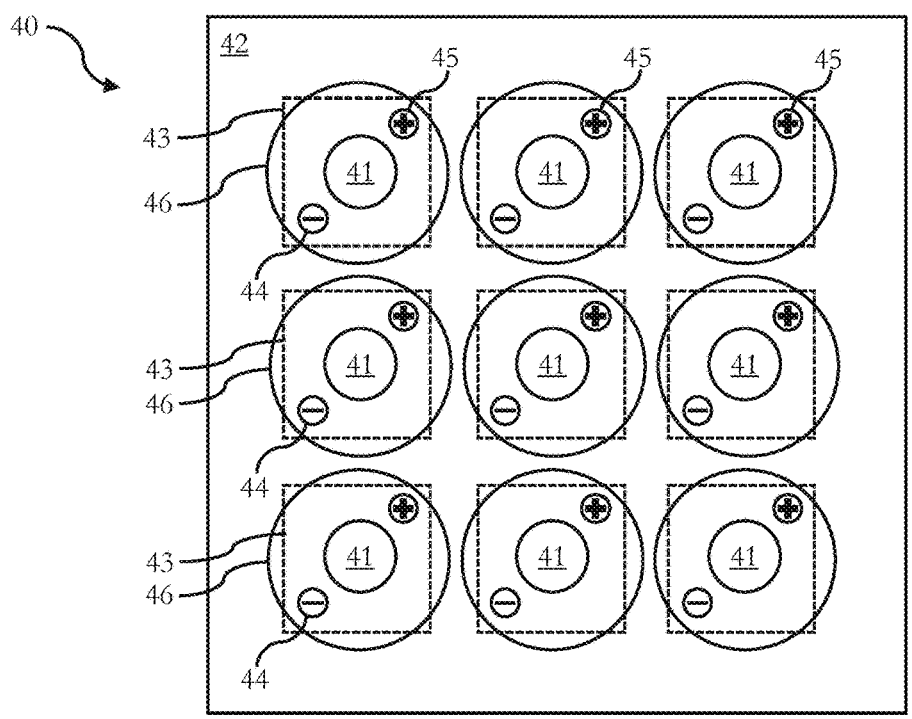
FIG. 4 illustrates another embodiment of an illuminator apparatus.

FIG. 4 illustrates an illuminator apparatus 40, which is generally similar to the apparatus 30 of FIG. 3. The apparatus 40 has a plurality of VCSEL cells 41 which are arranged in array, i.e. in multiple parallel rows and parallel columns, wherein the rows and columns are perpendicular to each other. The VCSEL cells 41 are arranged in a laser layer 42, which is similar to the laser layer 11 of FIG. 1.

Below the laser layer 42, a driver section (which may be implemented as a circuit layer similar to circuit layer 13 of FIG. 1) is located, which includes multiple drivers 43.

The driver section has multiple cathodes 44 and multiple anodes 45, wherein for each VCSEL cell 41 one pair of one cathode 44 and one anode 45 is provided.

The drivers 43 are located below each of the VCSEL cells 41 and each driver 43 is connected to the associated pair of cathode 44 and anode 45 for driving the associated VCSEL cell 41.

Moreover, a diffusor 46 is provided on top of the laser layer 42 for adjusting the light emitted from the VCSEL cells 41, wherein the diffusor 46 is such configured that for each VCSEL cell 21 the emitted light can be adjusted individually. In other embodiments the optical element to adjust the light can be different: instead of or in addition to the diffusor, a lens element, or any other optical elements, e.g. a light-pipe, a set of lens surfaces or the like, may be provided for light adjustment, as also indicated above.

Hence, in the embodiment of FIG. 4, the VCSEL cells 41 are each individually addressable and, thus, drivable, and also for each VCSEL cell the associated diffusor 46 is individually controllable.

Figure 5:
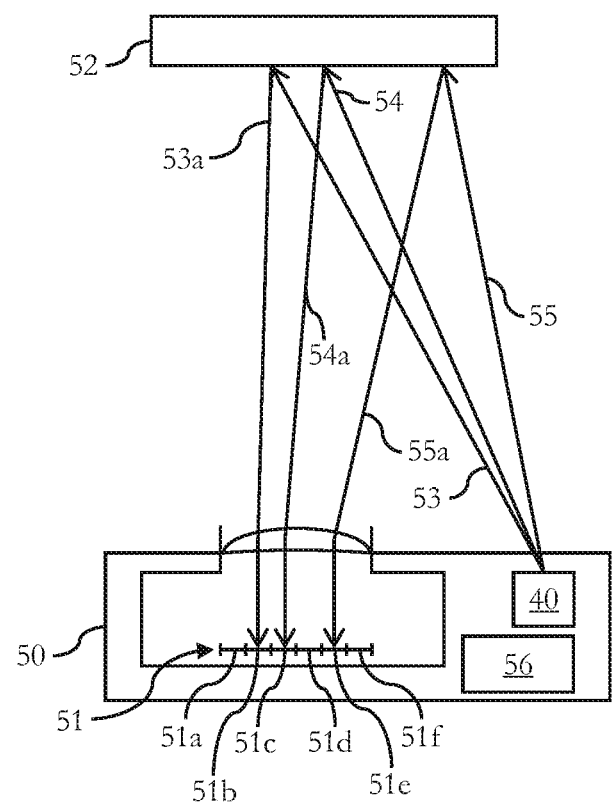
FIG. 5 illustrates an embodiment of a time-of-flight camera.

FIG. 5 illustrates an apparatus 50 which is configured as a time-of-flight camera 50.

The camera 50 has the illuminator apparatus 40 as discussed in FIG. 4 and an image sensor 51 which is a pixel sensor (e.g. CCD or CMOS based) and which has multiple pixels arranged in an array, wherein FIG. 5 exemplarily illustrates multiple pixels 51a, 51b, . . . , 51f.

A scene 52, which is a part of the world that is accessible, to the ToF camera 50, for illumination and/or image acquisition, is illuminated with light emitted from the illuminator apparatus 40, such as light rays 53, 54 and 55. The light rays 53, 54 and 55 are scattered or reflected by the scene 52 as scattered or reflected light rays 53a, 54a and 55a, respectively.

The scattered or reflected light rays 53a, 54a and 55a are incident on different pixels of the image sensor 51. In the present example, light ray 53a is incident on pixel 51b, light ray 54a is incident on pixel 51c and light ray 55a is incident on pixel 51e.

Moreover, circuitry 56, including a processor, memory, (wireless interface), storage, and the like, is provided in the camera 50. The circuitry 56 is connected to the illuminator apparatus 40 and the image sensor 51.

The circuitry 56 is configured to readout the information provided by the image sensor 51 upon detecting the incident light, e.g. light rays 53a, 54a and 55a, and it is configured to control the illuminator apparatus 40, e.g. by controlling the drivers 43 of the illuminator apparatus 40.

Moreover, the circuitry 56 may be configured to perform a calibration procedure as described herein and/or the circuitry 56 may be configured to perform any method as described herein.

In particular, the illuminator apparatus 40 and the camera 50 allow that light emitted from each illuminator (e.g. VCSEL, LED or the like) or group of illuminators (VCSEL, LED, or the like) can be guided or directed to a certain region of interest in the scene. If in such embodiments the illumination driver(s) is/are able to drive each of such zones individually, and the image sensor can choose which zone shall be integrated, e.g. by integrating light detection signals for respective pixels of the image sensor, a zone shutter can be provided.

As explicated above, these regions or zones may be overlapping or non-overlapping, depending on the specific application and specific embodiments. Overlapping may guarantee that the whole scene is illuminated and contributes to the active imaging, while non-overlapping may further allow to concentrate the light in even smaller zones or regions.

In the following, embodiments for such zone shutters are described under reference of FIGS. 6 to 8. The methods discussed in the following may be performed, for example, by circuitry 56 of camera 50.

Figure 6:
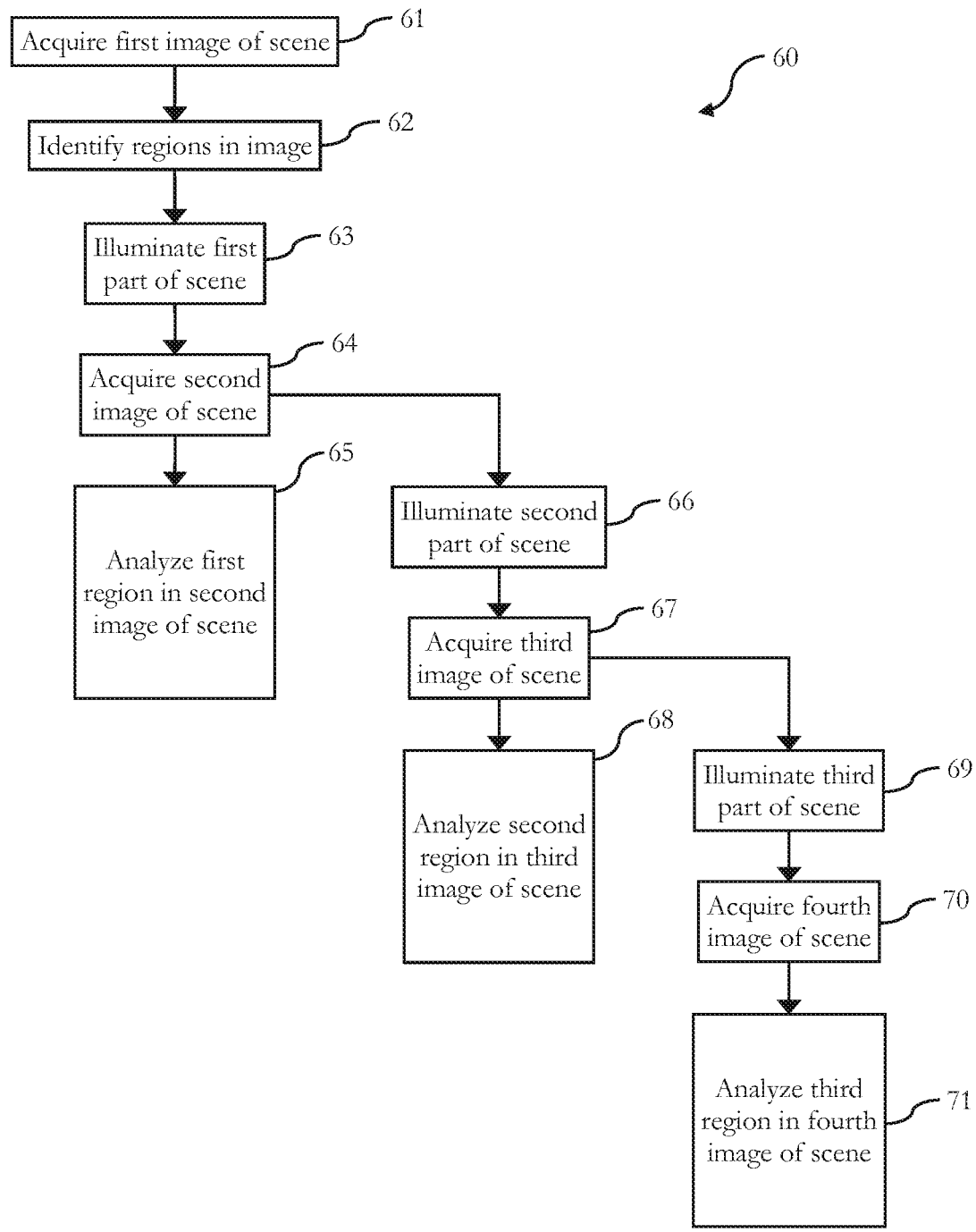
FIG. 6 shows a flow chart of an embodiment of a method for acquiring an image.

A method 60 for providing a zone shutter is explained under reference of FIG. 6.

In method 60, such a zone shutter is provided by sequentially scanning an image of a scene both on illumination and sensor side, i.e. by controlling the illuminator apparatus 40 and the image sensor 51 accordingly. For example, groups, such as VCSEL rows or columns or parts thereof, or any combination thereof, of the illuminator apparatus 40 can be used for illuminating a specific zone. Alternatively, or in addition, a diffusor, e.g. diffusor 46, can be controlled according to illuminate a specific region of the scene. Thereby, a rolling shutter mechanism is provided, which can use in some embodiments a primarily pipelined logic and which may have reduced bandwidth requirements. For example, fewer ADC's and ToF processing calculation logic may be needed for converting the data into depth or less post-processing of the data may be needed.

According to the method 60, at 61 a first image of the scene is acquired. This can be implemented by controlling the illuminator apparatus 40 and the image sensor 51 accordingly.

At 62, regions in the image are identified, e.g. regions of interest. Such regions may be regions in the image which require a longer exposure for increasing a SNR (signal-to-noise ratio), e.g. since they are further away or have a lower reflectivity. These regions can be exposed longer, whereas other regions can be illuminated and scanned for a shorter time period. Or, the regions may be regions in the image which correspond to parts of the scene that are to be observed, tracked, and/or analyzed. These regions may then be scanned by method 60, whereas other parts of the scene may, for example, be omitted.

Hence, at 63, a first part of the scene is illuminated and at 64 a second image of the scene or part of the scene is acquired, based on the illumination of the first part at 63.

The first region in the second image of the scene is analyzed at 65.

Simultaneously, at 66, a second part of the scene is illuminated and based on this illumination a third image of the scene or part of the scene is acquired at 67. At 68, the second region in the third image of the scene is analyzed.

Simultaneously, at 69, a third part of the scene is illuminated, and, based on this illumination, a fourth image of the scene or part of the scene is acquired at 70. At 71, the third region in the fourth image in the scene is analyzed, and so on. This is proceeded until all regions of the image, which have been identified at 62, are analyzed.

Thereby, the scene can be illuminated and scanned in accordance with the (rolling) zone shutter technology by controlling one zone after the other for illuminating, for example, the first, second, third, etc. part of the scene.

When implementing method 60 in camera 50, in some embodiments, a smart logic can be provided on the image sensor 51. With this smart logic, an instantaneous response level of the image sensor 51, e.g. of single pixels, can be detected and guidelines can be given to the overall ToF system for which zones light detection signals have to be integrated for a longer time.

This may be implemented, in some embodiments, by providing a flag, which indicates a certain exposure level which has been achieved, thereby allowing a scanning procedure to skip this zone for the future scanning and illumination.

A read-out procedure can look for these flags and may start conversion of the light detection signal into digital data based on detection of these flags. Furthermore, also a processing pipeline of the respective data may be started in response to detecting such a flag.

Thereby, an over-exposure of certain parts of the scene may be avoided. Also an under-exposure of parts which are far away and/or which have low reflective parts may be avoided. Furthermore, the available energy for illumination of the regions of the scene, which need the most intense illumination, may be optimized. In some embodiments, the illumination drivers allow to configure the intensity of the illuminators as well, so that for certain parts of the scene the light intensity could be chosen lower or higher.

For example, lenses tend to be less sensitive in corners than in the center (known as vignetting or relative illumination), therefore, in some embodiments, a zone shutter is created, which illuminates and integrates the image longer in the corners than in the center of the image.

For example, in an embodiment, 100 zones are provided on a VCSEL array, wherein each zone is driven by another laser driver, each laser driver being able to drive 1 W, and wherein each zone illuminates another region of the scene. When illuminating each region for 10 microseconds, all regions are illuminated after 1 millisecond with 1 W power. This is equivalent to simultaneously illuminating all 100 regions of the scene with a peak power of 100 W at 1% duty cycle (10 microseconds over 1 millisecond), but the 100 W is smeared out over 1 millisecond time. This can be continued for e.g. 10 times, and then read-out could be done.

In some embodiments, for example, the image acquisition of 61 may be omitted. Instead, a preconfigured image or an image received over a data connection such as a network may be used.

Similarly, the region identification of 62 may be omitted in some embodiments. Instead, information indicating the regions to be scanned may be preconfigured, or may be received over a data connection such as a network. In some embodiments, the image acquired in 61 may be transmitted over a network to a server, and then information indicating the regions to be scanned may be received from the server.

A further optimization is possible, in some embodiments, by providing that, during sequentially scanning over a plurality of ROIs (regions of interest) of a scene, only the pixels in the zone of the image sensor on which the current ROI is imaged are integrating the light detection signals, while the other pixels are ignored. Ignoring pixels can be achieved, e.g. by keeping them in reset, turning them off, or keeping them static, which means that these pixels stay static and stop using the modulated or pulsed signals, which are typically used in ToF cameras, without limiting the present disclosure to these specific examples. The image sensor may need specific adjustments to support the ability to ignore certain pixels or regions of pixels. This could involve, in some embodiments, adding extra or special routing, adding specific blocks (such as mix drivers, reset generators, delay lines, flip-flops, . . . ) or isolate certain driving signals (reset, TOF modulation signals, etc.) per region of pixels or per pixel. For example, for keeping pixels in reset, reset signals per region could be provided, a transistor to be able to select the pixel to be reset could be provided, and/or a memory element per pixel for the reset status could be provided. In a similar way, other mechanisms for ignoring pixels or regions of pixels can be designed by a person skilled in the art. Thereby second or third reflections which are present in the optical cavity of the camera or in the scene are ignored, which typically enter pixels outside the specific ROI. Hence, such reflections are ignored and can, thus, not create distance distortions which are also known as multipath (distortions or problem).

Further, ignoring certain pixels, also can reduce the overall power consumption of the image sensor, as these pixels are for example not required to do the integrating or ToF operation or do not need to be read-out.

In some embodiments, during the illumination steps (e.g. 63, 66 and 69), also multiple zones could be illuminated together. In this way the scanning time be reduced at run-time in some embodiments, as it will take less steps (e.g. 63-65, 66-68, 69-71) to acquire the whole scene. Multipath is also still reduced as described above, but with a slightly higher likelihood that a ray from one zone scatters into another zone being imaged simultaneously. The multiple zones illuminated per step could change randomly or may be pre-determined. In some embodiments, the average amount of illumination reaching each zone in the scene is controlled, which can be uniform or which can be defined according to the needs of the scene or system, as described above. The multiple zones could be located adjacent to each other, e.g. in rows, or the can be non-adjacent to each other. In some embodiments, at each step non-adjacent, randomly chosen, multiple zones are illuminated, such that the multipath, which is still present, changes from step to step. For example, in a system with hundred zones, when motion robustness is required, it could be chosen to illuminate ten zones simultaneously at each step, and each measurement could be taken with ten different random zones. Thereby, motion robustness is improved by a factor of ten, since now instead of hundred steps, only ten steps are needed. This multipath issue is illustrated in FIG. 7, where the camera 50 of FIG. 5 is used. The illuminator apparatus 40 emits to a scene 75 a first light ray 76, which illuminates a currently scanned ROI of the scene 75, and a second light ray 77, which illuminates a ROI of the scene 75 that is currently not scanned.

Figure 7:
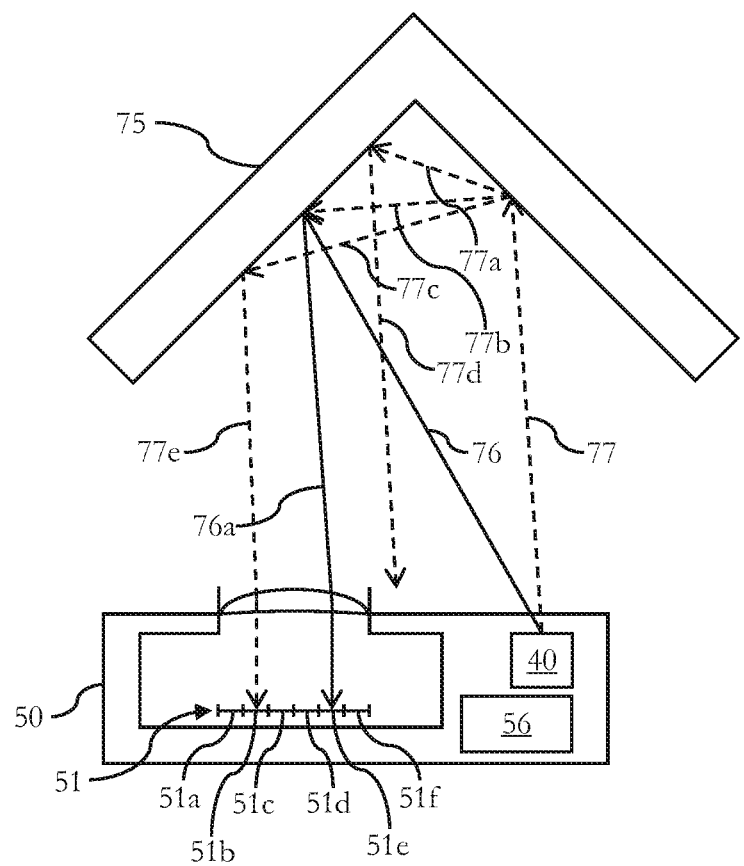
FIG. 7 illustrates the occurrence of multipaths.

The first light ray 76 is reflected by the scene 75 and the reflected light ray 76a falls on pixel 51e of image sensor 51, wherein the zone of the image sensor 51 corresponding to the current ROI is only pixel 51e in the example of FIG. 7.

Scene 75 causes multiple reflections of the second light ray 77 resulting in reflected rays 77a to 77e, wherein reflected light ray 77d does not enter the image sensor 51 at all, reflected light ray 77e falls on a respective pixel 51b which is outside the zone of the image sensor 51 corresponding to the current ROI, and reflected ray 77b is reflected, together with light ray 76a, onto pixel 51e. While light ray 77e incident on pixel 51b is ignored by the optimization described above, the reflection of light ray 77b onto pixel 51e may make further correction necessary. In a similar way multipath happening in the optical cavity or inside the lens stack, typically known as scatter, may be improved by ignoring some of the scattered reflections outside the ROI.

Therefore, in some embodiments, this technique requires a careful synchronization between the illumination apparatus, such as illumination apparatus 40, and an image sensor, such as image sensor 51. The zone of the image sensor 51 and the zone of the illumination apparatus 40 corresponding to the ROI need to be matched, hence the laser drivers, the VCSEL parts and the image sensor are orchestrated and designed together in some embodiments.

In some embodiments, mismatches may occur and to match all the timing for a specific PCB (printed circuit board) or camera implementation, a calibration procedure is provided in some embodiments, as also mentioned above. For the calibration procedure, the camera or module may be arranged with respect to a predefined scene (e.g. plane wall, plane white paper, or the like). In the calibration procedure, for a specific camera or module with its tolerances, each zone is activated in the illumination apparatus and the image sensor detects which pixels are receiving the illumination signal, how intense the illumination signal is and with which delay it is detected. From this set of information, which may be provided per zone, an intensity pattern is determined on the receiving side. On the basis of this information, a scanning pattern can be chosen, and a decision may be made which pixels shall be turned on and which shall be turned off for each ROI of the scene. Also overlapping zones can be designed, in some embodiments, depending on a specific purpose. In some embodiments, this is achieved based on a design-in redundancy to guarantee sufficient data and functionality for ease of use and manufacturing. Another approach could be to limit the illumination to non-overlapping zones, so that the light is even further concentrated. In that case it is to be noted that, in some embodiments, not the whole scene will be illuminated, which may be suitable for certain applications.

In some embodiments, during operation, certain zones of the image sensor 51 may be in integration/acquisition mode, and certain zones in read-out mode, as also indicated above in association with method 60. In such embodiments, a rolling shutter is implemented by starting with the first zone in acquisition mode (e.g. at 64), and when shifting to the next zone (e.g. at 66), the read-out of the first zone is done in parallel (e.g. analysis at 65).

Other arbitrary read-out schemes may be implemented, such as interlaced or scene dependent or even random read-out schemes. Also certain zones could be read-out and illuminated more intense to achieve higher frame rate for those zones alone and thereby enable better motion robustness, in some embodiments.

Figure 8:
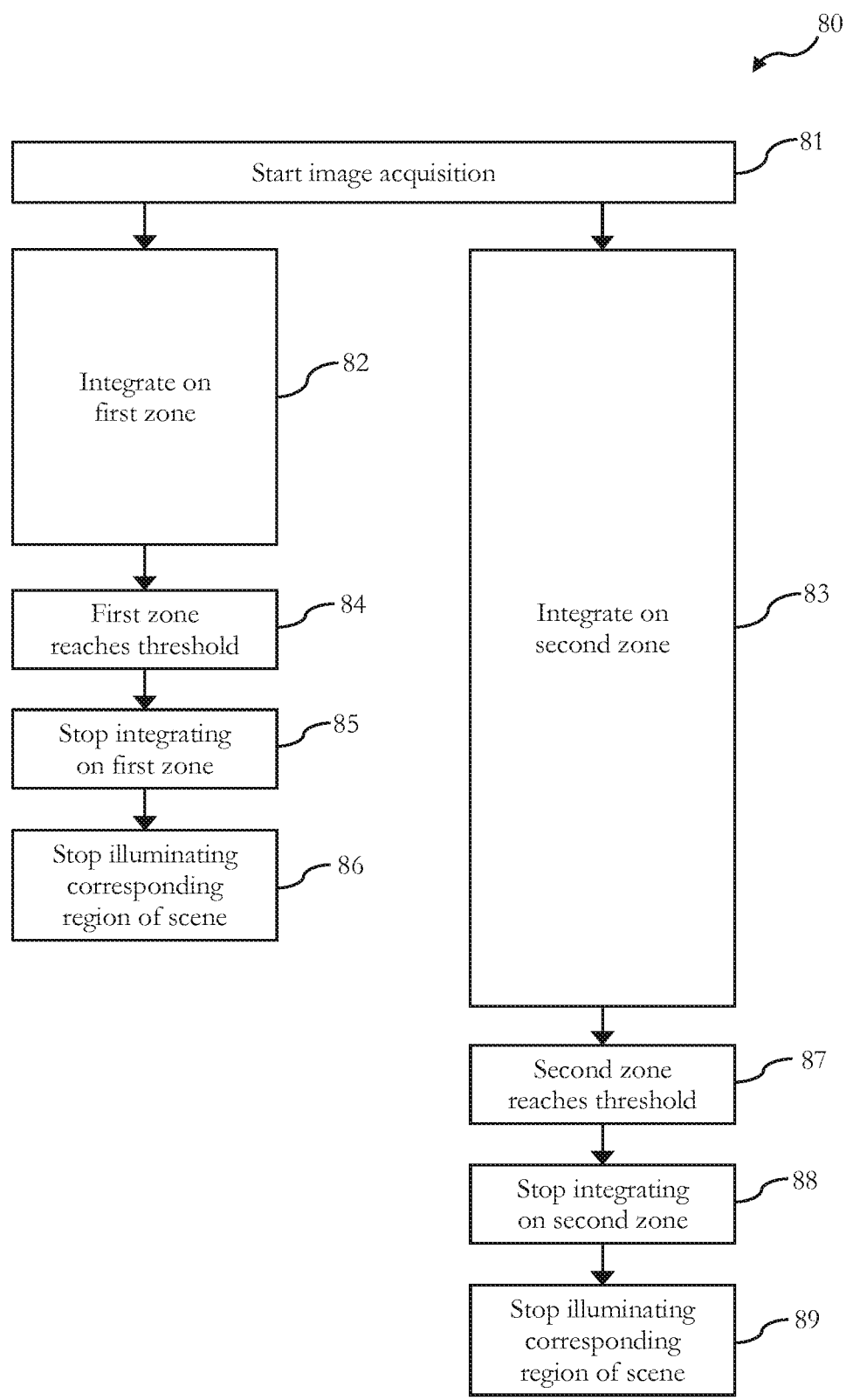
FIG. 8 shows a flow chart of an embodiment of a method for acquiring an image.

In another embodiment, illustrated as method 80 in FIG. 8, a pixel architecture with a flag is used, wherein the flag is set high when sufficient light detection signal of a ROI of the scene is integrated in the corresponding zone. In this way, multiple scans of the different ROIs can be made, as described earlier (e.g. in connection with FIG. 6 and method 60 above), but those ROIs with sufficient signal can be skipped based on this flag. An example of such a pixel can be easily built and it is generally known, for example, from EP 2 874 388 A1 and EP 2 894 492 A1.

At 81, method 80 starts with the image acquisition by controlling the illuminator apparatus 40 and the image sensor 51 accordingly.

At 82, light detection signals for a first region detected in a first zone of the image sensor 51 are integrated and at 83, in parallel, light detection signals for a second region detected in a second zone of the image sensor 51 are integrated (of course, more regions can be provided).

At 84, the integration of the light detection signals of the first zone reaches the threshold, which may be indicated by the flag discussed above. Then the integration for the first zone is stopped at 85 and the illumination of the corresponding region of the scene is stopped at 86.

In some embodiments method 60 may be used, so that the regions of method 80 are not integrated in parallel but sequentially scanned. In this case stopping integration means that the steps corresponding to illuminating this part of the scene (63-65, 66-68 and 69-71) are skipped. Hence, some embodiments pertain to a combination of methods 60 and 80 as discussed herein.

As for the second zone a longer integration is necessary, the second zone reaches the threshold for the light detection signal integration at 87, which may be indicated by the flag, at a later point of time than for the first zone.

Then, the integration of the light detection signals for the second zone is stopped at 88 and the illumination of the corresponding region of the scene is also stopped at 89.

A way to implement the detection of the integration threshold of the light detection signal (flag) is to track the lowest voltage of the detected ToF signals. Once the lowest voltage hits a certain desired voltage level, the flag is set high and read-out occurs in the next cycle, followed by reset and a restart of the integration. The desired voltage level is connected to the desired amount of signal received. Typically the lower the voltage, the higher is the amount of signal received, and, thus, the longer it takes before the flag will be high.

Since some embodiments use zones that can span more than one pixel, a read-out of a zone may be started as soon as one pixel of the zone has its read-out flag high. It can then be opted in some embodiments to keep the illumination of this zone on, read-out only this one pixel, and reset only this one pixel, and continue integration, or it can be opted to decide to stop illuminating this zone, and only illuminate the other zones. This decision could be triggered by having one pixel ready for read-out or multiple/specific pixels or all pixels. For example, if only closest pixels are of interest, it could be beneficial to stop once one pixel or a minimum of pixels has attained its desired signal level, depending on the context and requirements of the application In ToF typically the ambient light and active light are captured on different nodes or in different ways. For example, the ambient light often creates common mode signal, and the active light creates differential signal. Hence, in some embodiments, an ambient light signal flag as well as an active signal flag are provided so that targets can be chosen differently per zone, e.g. for ambient light and active light. Typically ambient light will create saturation and is to be avoided, while a high level of differential mode is desired in some embodiments.

Many other criteria can serve as flags in the above context to determine the zones, integration times and other potential factors, such as illumination intensity. Examples are the detection of a certain pattern or object, certain activity or absence of activity, or a temperature or power management system, wherein this last example could, for example, set the flags so that every other zone is skipped and power is saved.

The rolling shutter or scanning pattern allows for pipe-lining the ToF calculation processes in some embodiments. For example, electronic blocks such as ADCs, cordic calculation blocks, CAPD mix drivers, Time-to-digital-convertors, SPAD Quenching circuits, histogram builders, etc. can be dimensioned for one or a few zones in some embodiments, and may be re-used every time a new zone is selected. This way significant lower area with similar or better quality is made possible in some embodiments.

The methods as described herein are also implemented in some embodiments as a computer program causing a computer and/or a processor and/or a circuit to perform the method, when being carried out on the computer and/or processor and/or circuit In some embodiments, also a non-transitory computer-readable recording medium is provided that stores therein a computer program product, which, when executed by a processor or circuit, such as the circuit described above, causes the methods described herein to be performed.

It should be recognized that the embodiments describe methods with an exemplary ordering of method steps. The specific ordering of method steps is however given for illustrative purposes only and should not be construed as binding.

All units and entities described in this specification and claimed in the appended claims can, if not stated otherwise, be implemented as integrated circuit logic, for example on a chip, and functionality provided by such units and entities can, if not stated otherwise, be implemented by software.

In so far as the embodiments of the disclosure described above are implemented, at least in part, using software-controlled data processing apparatus, it will be appreciated that a computer program providing such software control and a transmission, storage or other medium by which such a computer program is provided are envisaged as aspects of the present disclosure.

Note that the present technology can also be configured as described below.

(1) An apparatus including:
an illumination layer including an array of a plurality of illuminators; and
a circuit layer including one or more drivers for controlling the plurality of illuminators; wherein
the illumination layer and the circuit layer overlap at least partially; and wherein
each driver of the one or more drivers controls at least one illuminator of the plurality of illuminators.

(2) The apparatus of (1), wherein the illuminator includes a Vertical Cavity Emitting Laser.

(3) The apparatus of (1) or (2), wherein
the laser layer and the circuit layer are stacked to each other.

(4) The apparatus of anyone of (1) to (3), further including:
a support substrate, wherein
the laser layer and the circuit layer are stacked on the support substrate.

(5) The apparatus of (3) or (4), wherein
the illumination layer is grown onto a support substrate and the circuit layer is stacked on the illumination layer or wherein the circuit layer is grown on the support substrate and the illumination layer is stacked on the circuit layer.

(6) The apparatus of anyone of (1) to (5), wherein the circuit layer includes a plurality of drivers for controlling the plurality of illuminators; and wherein
illuminators of the plurality of illuminators are arranged in a first row and a second row, and
a first driver of the plurality of drivers is configured to control the illuminators of the first row, and a second driver of the plurality of drivers is configured to control the illuminators of the second row.

(7) The apparatus of anyone of (1) to (6), wherein
each driver of the one or more drivers is configured to control one illuminator of the plurality of illuminators, or wherein each driver of the one or more drivers is configured to control a subset of illuminators of the plurality of illuminators.

(8) The apparatus of anyone of (1) to (7), further including
an optical element configured to adjust light emitted by the plurality of illuminators.

(9) The apparatus of anyone of (1) to (8), further including
a first optical element configured to adjust light emitted by at least one illuminator of the plurality of illuminators which is controlled by a first driver of the plurality of drivers, and
a second optical element configured to adjust light emitted by at least one illuminator of the plurality of illuminators which is controlled by a second driver of the plurality of drivers.

(10) The apparatus of anyone of (1) to (9), further including multiple adjustable lenses for adjusting light emitted from the plurality of illuminators.

(11) The apparatus of anyone of (1) to (10), further including:
an image sensor, and
circuitry configured to control the image sensor and the one or more drivers.

(12) The apparatus of (11), wherein the circuitry is further configured to sequentially drive at least a subset of drivers of the one or more, thereby providing a zone shutter procedure.

(13) The apparatus of (12), wherein the zones are overlapping.

(14) The apparatus of (12), wherein the zones are non-overlapping.

(15) The apparatus of (11) or (14), wherein at least one of the circuitry and the image sensor is further configured to control pixels in a zone of the image sensor on which a current region of interest is imaged to integrate light detection signals.

(16) The apparatus of anyone of (11) to (15), wherein the circuitry is further configured to perform a calibration procedure.

(17) The apparatus of anyone of (11) to (16), wherein the circuitry is further configured to perform a time-of-flight measurement.

(18) A method including:
illuminating, with illumination light originating from an illuminator apparatus, a scene, and
   acquiring an image of the scene; wherein
   the illuminator apparatus includes:
   an illumination layer including an array of a plurality of illuminators, and
   a circuit layer including one or more drivers for controlling the plurality of illuminators, wherein
   the illumination layer and the circuit layer overlap at least partially, and wherein
   each driver of the one or more drivers controls at least one illuminator of the plurality of illuminators.

(19) The method of (18), further including:
identifying regions of the image, based on illumination light detected.

(20) The method of (18) or (19), further including:
illuminating a first part of the scene corresponding to a first region of the image at a first time,
   acquiring an image of the scene at a second time,
   illuminating a second part of the scene corresponding to a second region of the image at a third time, and
   acquiring an image of the scene at a fourth time.

(21) The method of anyone of (18) to (20), further comprising integrating light detection signals of pixels in a zone of the image sensor on which the current region of interest is imaged.

(22) The method of anyone of (18) to (21), further including:
performing an image processing procedure on a region of a first image while acquiring a second image.

(23) The method of anyone of (18) to (22), further including:
integrating, during image acquisition, a light detection signal of a first region of the image for a longer time than a light detection signal of a second region of the image.

(24) The method of anyone of (18) to (23), further including:
integrating, during image acquisition, a light detection signal of a region of the image until an amount of illumination light detected reaches a threshold.

(25) The method of anyone of (18) to (24), further including:
integrating, during image acquisition, a light detection signal of a first region of the image, while not integrating a light detection signal of a second region of the image.

(26) A computer program including program code causing a computer to perform the method according to anyone of (18) to (25), when being carried out on a computer.

(27) A non-transitory computer-readable recording medium that stores therein a computer program product, which, when executed by a processor, causes the method according to anyone of (18) to (25) to be performed.

The invention claimed is:

1. An apparatus comprising:
an illumination layer including an array of a plurality of illuminators;
a circuit layer including one or more drivers for controlling the plurality of illuminators;
an image sensor; and
circuitry configured to control the image sensor and the one or more drivers;
wherein the illumination layer and the circuit layer overlap at least partially;
wherein each driver of the one or more drivers controls at least one illuminator of the plurality of illuminators; and
wherein a respective driver is disposed directly below a respective illuminator; and
wherein the illumination layer and the circuit layer are stacked directly on each other; and
wherein at least one of the circuitry and the one or more drivers is configured to control a subset of the plurality of illuminators corresponding to a first region; and
wherein at least one of the circuitry and the image sensor is further configured to control a subset of pixels on which the first region is imaged to integrate light detection signals.

2. The apparatus of claim 1, wherein the plurality of illuminators include a Vertical Cavity Emitting Laser.

3. The apparatus of claim 1, wherein
the illumination layer is grown onto a support substrate and the circuit layer is stacked on the illumination layer or wherein the circuit layer is grown on the support substrate and the illumination layer is stacked on the circuit layer.

4. The apparatus of claim 1, and wherein
illuminators of the plurality of illuminators are arranged in a first row and a second row, and
a first of the plurality of drivers is configured to control the illuminators of the first row, and a second driver of the one or more drivers is configured to control the illuminators of the second row.

5. The apparatus of claim 1, wherein
each driver of the one or more drivers is configured to control one illuminator of the plurality of illuminators, or wherein each driver of the one or more drivers is configured to control a subset of illuminators of the plurality of illuminators.

6. The apparatus of claim 1, further comprising
a first optical element configured to adjust light emitted by at least one illuminator of the plurality of illuminators which is controlled by a first driver of the one or more drivers, and
a second optical element configured to adjust light emitted by at least one illuminator of the plurality of illuminators which is controlled by a second driver of the one or more drivers.

7. The apparatus of claim 1, wherein the circuitry is further configured to sequentially drive at least a subset of drivers of the one or more drivers, thereby providing a zone shutter procedure.

8. The apparatus of claim 1, wherein the circuitry is further configured to perform a calibration procedure.

9. The apparatus of claim 1, wherein the circuitry is further configured to perform a time-of-flight measurement.

10. A method comprising:
illuminating, with illumination light originating from an illuminator apparatus, a scene, and acquiring an image of the scene; wherein the illuminator apparatus comprises:
- an illumination layer including an array of a plurality of illuminators,
- a circuit layer including one or more drivers for controlling the plurality of illuminators,
- an image sensor, and
- circuitry configured to control the image sensor and the one or more drivers, wherein the illumination layer and the circuit layer overlap at least partially, wherein each driver of the one or more drivers controls at least one illuminator of the plurality of illuminators; and wherein a respective driver is disposed directly below a respective illuminator; and wherein the illumination layer and the circuit layer are stacked directly on each other; and wherein at least one of the circuitry and the illumination layer is configured to control a subset of the plurality of illuminators corresponding to a first region; and wherein at least one of the circuitry and the image sensor is further configured to control a subset of pixels on which the first region is imaged to integrate light detection signals.

11. The method of claim 10, further comprising:
identifying regions of the image, based on illumination light detected.

12. The method of claim 10, further comprising:
- illuminating a first part of the scene corresponding to the first region of the image at a first time,
- acquiring an image of the scene at a second time,
- illuminating a second part of the scene corresponding to a second region of the image at a third time, and
- acquiring an image of the scene at a fourth time.

13. The method of claim 10, further comprising:
performing an image processing procedure on a region of the first image while acquiring a second image.

14. The method of claim 10, further comprising:
integrating, during image acquisition, a light detection signal of the first region of the image for a longer time than a light detection signal of a second region of the image.

15. The method of claim 10, further comprising:
integrating, during image acquisition, a light detection signal of the first region of the image until an amount of illumination light detected reaches a threshold.

16. The method of claim 10, further comprising:
integrating, during image acquisition, a light detection signal of the first region of the image, while not integrating a light detection signal of a second region of the image.

* * * * *